(12) United States Patent
Wei et al.

(10) Patent No.: US 11,600,666 B2
(45) Date of Patent: Mar. 7, 2023

(54) MULTITIER ARRANGEMENTS OF INTEGRATED DEVICES, AND METHODS OF FORMING SENSE/ACCESS LINES

(71) Applicant: Micron Technology, Inc., Boise, ID (US)

(72) Inventors: Lei Wei, Boise, ID (US); Hongqi Li, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 214 days.

(21) Appl. No.: 17/170,488

(22) Filed: Feb. 8, 2021

(65) Prior Publication Data

US 2021/0167132 A1 Jun. 3, 2021

Related U.S. Application Data

(62) Division of application No. 16/400,572, filed on May 1, 2019, now Pat. No. 10,957,741.

(51) Int. Cl.
*H01L 27/24* (2006.01)
*H01L 23/528* (2006.01)
*H01L 45/00* (2006.01)

(52) U.S. Cl.
CPC ........ *H01L 27/2481* (2013.01); *H01L 23/528* (2013.01); *H01L 27/2427* (2013.01);
(Continued)

(58) Field of Classification Search
CPC ............. H01L 27/2481; H01L 27/2427; H01L 23/528; H01L 45/1233
See application file for complete search history.

(56) References Cited

U.S. PATENT DOCUMENTS 7,858,468 B2 12/2010 Liu et al.
8,124,951 B2 * 2/2012 Lee ..................... H01L 27/2409
257/5

(Continued)

FOREIGN PATENT DOCUMENTS

EP 1796103 6/2007
EP 20798313 6/2022

(Continued)

*Primary Examiner* — Dale E Page
*Assistant Examiner* — Wilner Jean Baptiste
(74) *Attorney, Agent, or Firm* — Wells St. John P.S.

(57) ABSTRACT

Some embodiments include an arrangement having a memory tier with memory cells on opposing sides of a coupling region. First sense/access lines are under the memory cells, and are electrically connected with the memory cells. A conductive interconnect is within the coupling region. A second sense/access line extends across the memory cells, and across the conductive interconnect. The second sense/access line has a first region having a second conductive material over a first conductive material, and has a second region having only the second conductive material. The first region is over the memory cells, and is electrically connected with the memory cells. The second region is over the conductive interconnect and is electrically coupled with the conductive interconnect. An additional tier is under the memory tier, and includes CMOS circuitry coupled with the conductive interconnect. Some embodiments include methods of forming multitier arrangements.

18 Claims, 13 Drawing Sheets

(52) U.S. Cl.
CPC .......... *H01L 45/06* (2013.01); *H01L 45/1233* (2013.01); *H01L 45/144* (2013.01); *H01L 45/16* (2013.01)

(56) References Cited

U.S. PATENT DOCUMENTS

| | | |
|---|---|---|
| 8,847,186 B2 | 9/2014 | Redaeili et al. |
| 9,595,564 B1 * | 3/2017 | Ikedo .................... H01L 45/04 |
| 9,659,998 B1 | 5/2017 | Lung |
| 10,134,470 B2 | 11/2018 | Tortorelli et al. |
| 2007/0132049 A1 | 6/2007 | Stipe |
| 2010/0264393 A1 | 10/2010 | Mikawa et al. |
| 2012/0008366 A1 | 1/2012 | Lu |
| 2015/0194603 A1 | 7/2015 | Terai et al. |
| 2016/0247565 A1 | 8/2016 | Perner et al. |
| 2017/0077183 A1 | 3/2017 | Ikedo |

FOREIGN PATENT DOCUMENTS

| | | |
|---|---|---|
| JP | 2008-091601 | 4/2008 |
| JP | 2011-211039 | 10/2011 |
| TW | 201019416 | 5/2010 |
| TW | 201801300 | 1/2018 |
| TW | 109114275 | 12/2020 |
| WO | WO PCT/US2020/027390 | 7/2020 |
| WO | WO PCT/US2020/027390 | 11/2021 |

* cited by examiner

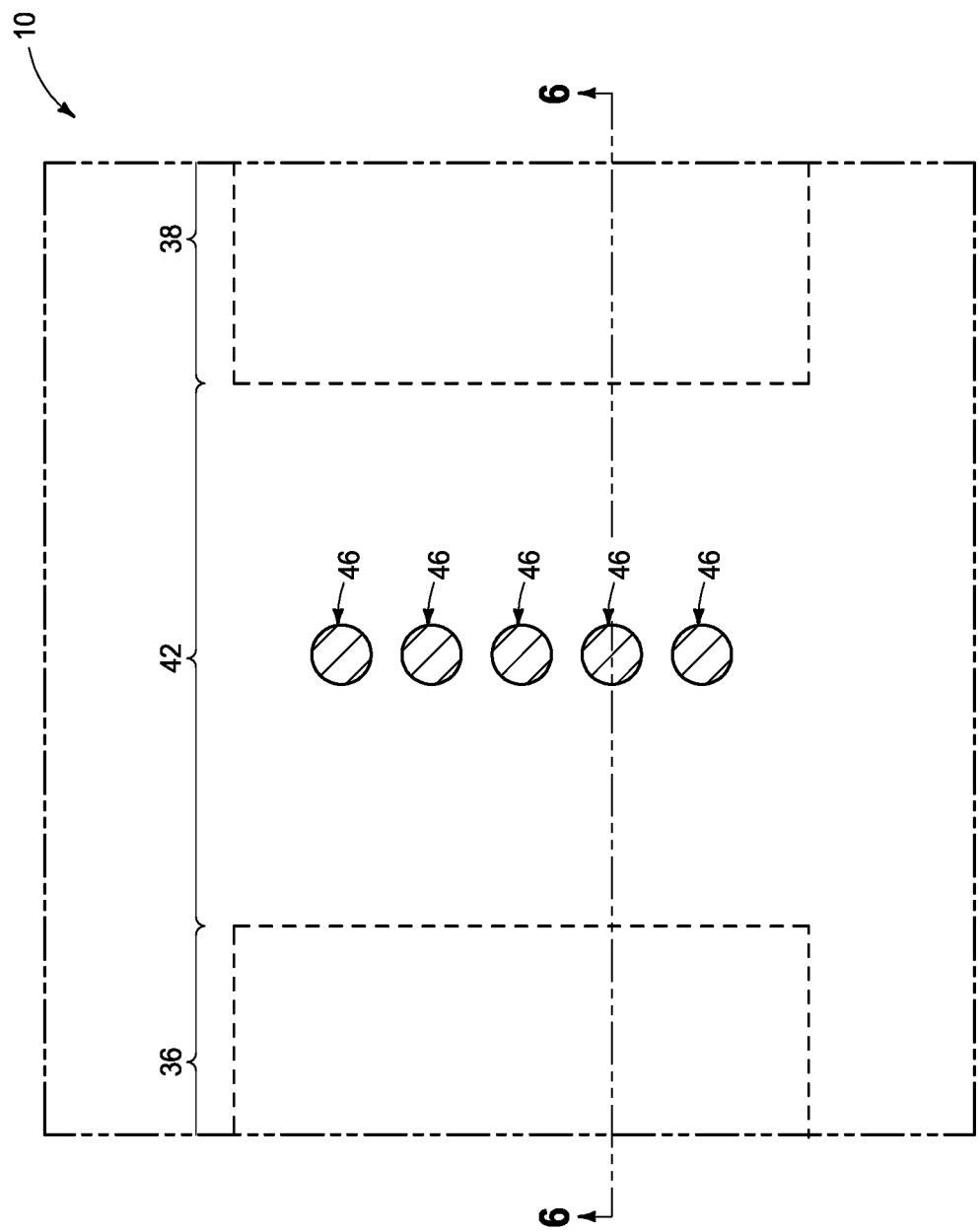

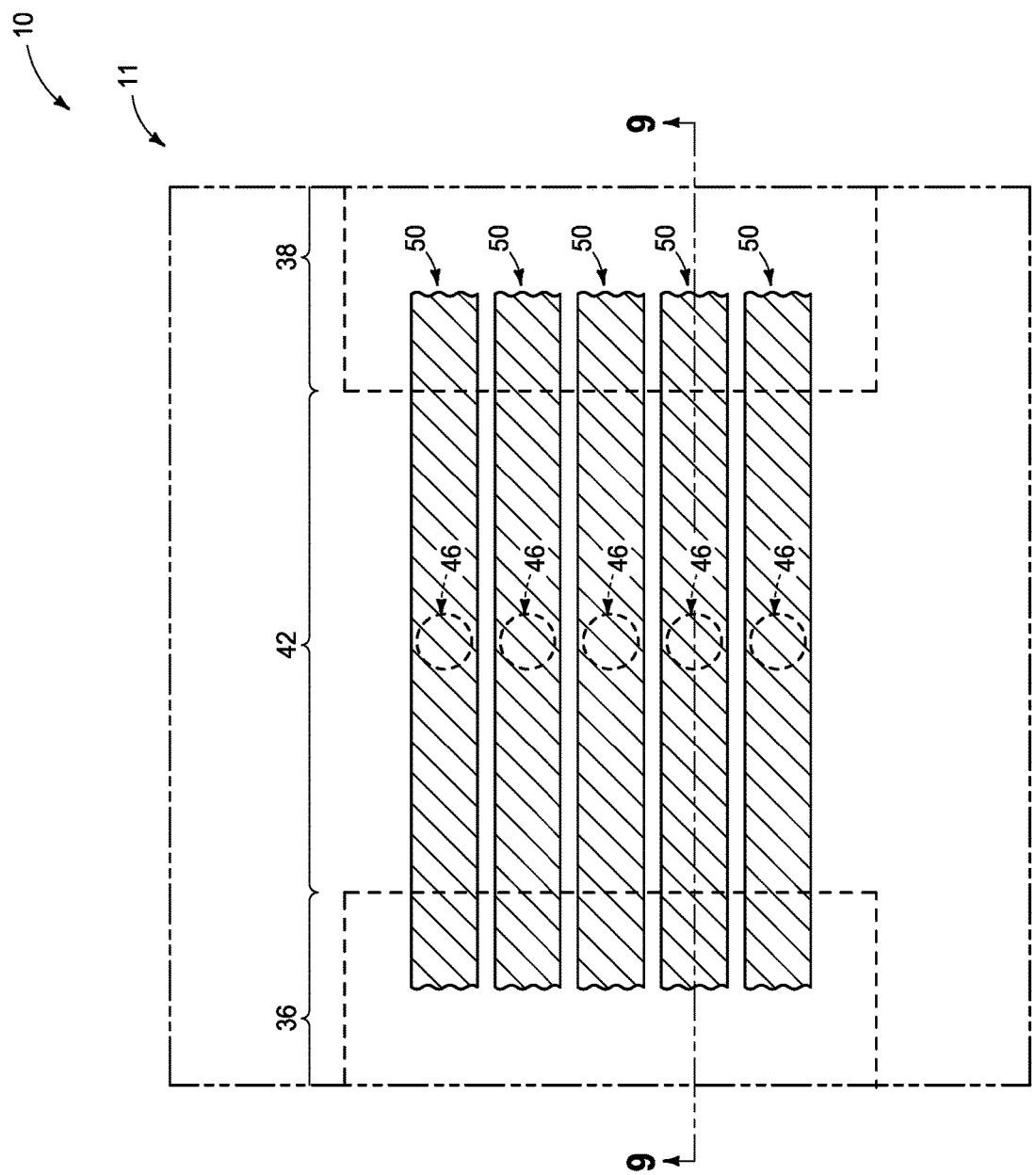

MULTITIER ARRANGEMENTS OF INTEGRATED DEVICES, AND METHODS OF FORMING SENSE/ACCESS LINES

This patent resulted from a divisional of U.S. patent application Ser. No. 16/400,572 filed May 1, 2019 which is hereby incorporated by reference.

TECHNICAL FIELD

Multitier arrangements of integrated devices, and methods of forming sense/access lines.

BACKGROUND

Efforts are being directed toward forming multitier arrangements of integrated devices. For instance, a tier comprising memory may be formed over a tier comprising drivers, sense amplifiers, etc. It may be desired to form sense/access lines (e.g., bitlines) which are coupled with memory devices of the upper tier, and which are also coupled with components of the lower tier through interconnects that extend through the upper tier. It would be desirable to develop structures specifically configured to be suitable for such applications, and to develop methods of forming such structures.

BRIEF DESCRIPTION OF THE DRAWINGS

FIG. 6A is a diagrammatic top view of a region of the assembly of FIG. 6. The cross-section of FIG. 6 is along the line 6-6 of FIG. 6A.

FIG. 9A is a diagrammatic top view of a region of the assembly of FIG. 9. The cross-section of FIG. 9 is along the line 9-9 of FIG. 9A.

DETAILED DESCRIPTION OF THE ILLUSTRATED EMBODIMENTS

Some embodiments include multitier architectures in which a memory tier is over a tier comprising CMOS circuitry, and in which components of the memory tier are electrically coupled with the CMOS circuitry through conductive interconnects. In some embodiments, sense/access lines (e.g., bitlines) may extend across the memory cells and the conductive interconnects, and may have different compositional configurations over the memory cells than over the conductive interconnects. In some applications, regions of the sense/access lines which are over and directly against the conductive interconnects will have lower resistance (i.e., higher conductivity) than regions which are over and directly against electrodes of the memory cells. Some embodiments include methods of forming multitier architectures. Example embodiments are described with reference to FIGS. 1-9.

Figure 1:
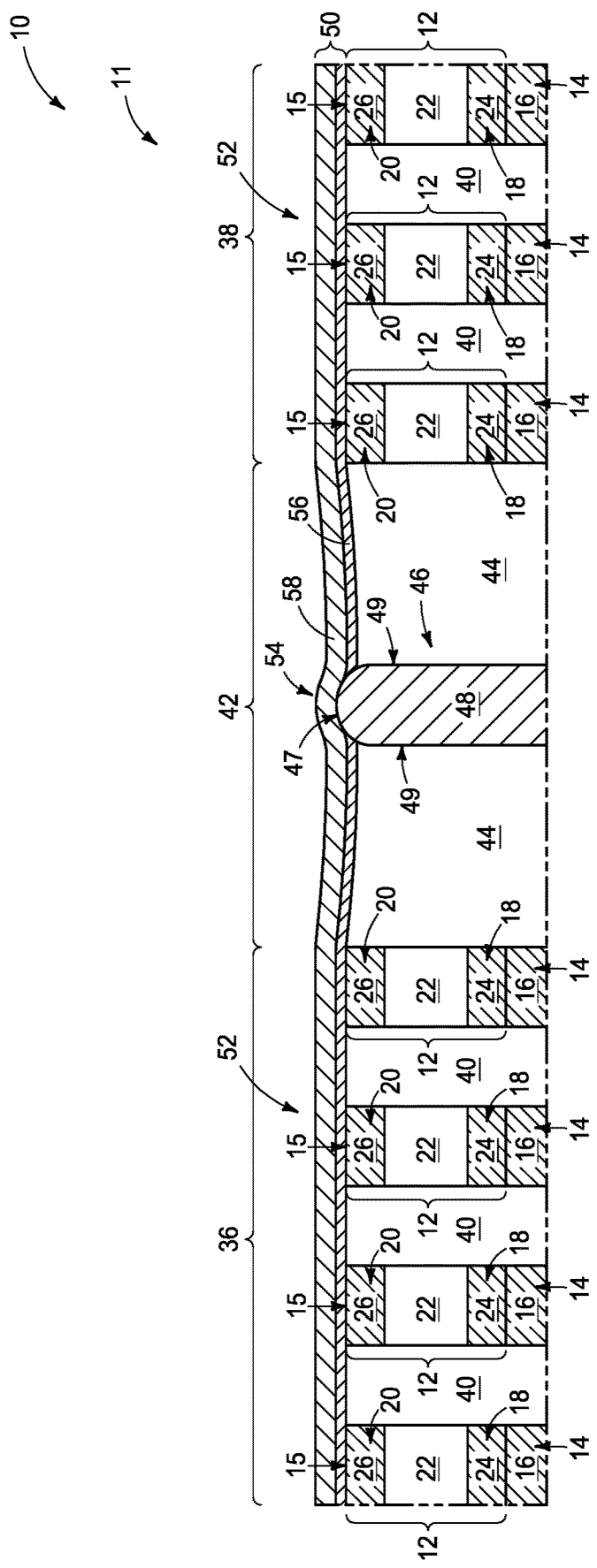
FIG. 1 is a diagrammatic cross-sectional side view of an example assembly comprising an example arrangement of memory cells.

Referring to FIG. 1, an assembly 10 shows an example configuration for coupling a bitline (50) to memory cells (12) and a conductive interconnect (46).

The assembly 10 includes a memory array 11, which comprises the memory cells 12. The memory cells 12 are supported by wordlines (access lines) 14. The illustrated memory cells 12 may be representative of a large number of substantially identical memory cells within the memory array 11; and in some embodiments the memory array 11 may comprise hundreds, thousands, millions, hundreds of millions, etc., of the memory cells. The term "substantially identical" means identical to within reasonable tolerances of fabrication and measurement. The illustrated wordlines 14 may be representative of a large number of substantially identical wordlines within the memory array.

The wordlines 14 comprise conductive material 16. The conductive material 16 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 16 may comprise one or more metals and/or metal-containing compositions; and may, for example, comprise tungsten over tantalum nitride.

Each of the memory cells 12 comprises a bottom electrode 18, a top electrode 20, and a programmable material 22 between the top and bottom electrodes. The electrodes 18 and 20 comprise conductive electrode materials 24 and 26, respectively. The electrode materials 24 and 26 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). The electrode materials 24 and 26 may be the same composition as one another, or may be of different compositions relative to one another. In some example embodiments, the electrode materials 24 and 26 may comprise, consist essentially of, or consist of one or more of TiSiN (titanium silicon nitride), TiAlN (titanium aluminum nitride), TiN (titanium nitride), WN (tungsten nitride), Ti (titanium), C (carbon) and W (tungsten); where the formulas indicate the components within the listed substances, rather than designating specific stoichiometries of such components.

The bottom electrodes 18 are electrically coupled with the wordlines 14, and in the shown embodiment are directly against the wordlines.

The programmable material 22 may comprise any suitable composition(s). In some embodiments, the programmable material 22 may be an ovonic memory material, and specifically may be a chalcogenide. For instance, the programmable material 22 may comprise one or more of germanium (Ge), antimony (Sb), tellurium (Te) and indium (In). In specific embodiments, the programmable material 22 may, for example, comprise, consist essentially of, or consist of GeSbTe or InGeTe, where the formulas indicate the components within the listed substances, rather than designating specific stoichiometries of such components. In some embodiments, the memory cells may comprise programmable material configured to be utilized in self-selecting devices; for example, a chalcogenide material may act both as a storage element and as a select device. The chalcogenide may be utilized alone in the self-selecting device, or may be utilized in combination with another composition. Example self-selecting PCM devices (with PCM devices being devices comprising phase change material) are described in U.S. Pat. No. 8,847,186 (Redaelli et al.) and U.S. Pat. No. 10,134,470 (Tortorelli et al.), listing Micron Technology, Inc. as the assignee.

The memory cells 12 are example memory cells which may be utilized in a memory array. In other embodiments, the memory cells may have other configurations. For instance, FIG. 1B shows a memory cell 12a having another example configuration. The memory cell includes the electrodes 18 and 20, and further includes a third electrode 28. In some embodiments, the electrodes 28, 18 and 20 may be referred to as a bottom electrode, a middle electrode, and a top electrode, respectively. The electrode 28 comprises electrode material 30. Such electrode material may comprise any of the compositions described above relative to the electrode materials 24 and 26; and may be the same composition as one or both of the electrode materials 24 and 26, or may be compositionally different than at least one of the electrode materials 24 and 26.

The ovonic material 22 may be referred to as a first ovonic material between the upper electrode 20 and the middle electrode 18. A second ovonic material 32 is between the lower electrode 28 and the middle electrode 18. The second ovonic material 32 may be incorporated into an ovonic threshold switch (OTS) of a select device 34. The memory cell 12a may thus comprise the programmable material 22 in combination with the select device 34, rather than being in a self-selecting configuration.

The ovonic material 32 may comprise any suitable composition(s), and in some embodiments may comprise one or more of the compositions described above as being suitable for the programmable material 22.

Referring again to FIG. 1, the wordlines 14 may be considered to extend in and out of the page relative to the cross-sectional view. Insulative material 40 is between the wordlines, and spaces the wordlines from one another. The insulative material 40 also isolates neighboring memory cells 12 from one another. The insulative material 40 may comprise any suitable composition(s); and in some embodiments may comprise, consist essentially of, or consist of silicon dioxide.

The cross-sectional view of FIG. 1 shows the memory cells 12 arranged to form a first set 36 and a second set 38. A coupling region 42 is between the first and second sets (36, 38) of the memory cells.

An insulative material 44 extends across the coupling region 42. The insulative material 44 may comprise any suitable composition(s); and in some embodiments may comprise, consist essentially of, consist of silicon dioxide. The insulative material 44 may be referred to as an intervening insulative material in some of the applications described herein.

The conductive interconnect 46 is within the coupling region 42. The conductive interconnect comprises conductive material 48. The conductive material 48 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). The conductive interconnect 46 may extend entirely through a tier (i.e., deck, level, etc.) comprising the memory array 11. The conductive interconnect 46 may comprise multiple compositions, and may comprise different compositions at various locations throughout the tier. The illustrated portion of the conductive interconnect 46 may comprise, consist essentially of, or consist of tungsten in some example embodiments.

The memory cells 12 have upper surfaces 15 along the upper electrodes 20, and the interconnect 46 has an upper surface 47. The illustrated upper surfaces 15 are planar. In other embodiments, the upper surfaces 15 may have other suitable configurations. The illustrated upper surface 47 is dome-shaped. In other embodiments, the upper surface 47 may be planar, or may have any other suitable shape.

The bitline (digit line, sense line) 50 extends across the first and second sets (36, 38) of the memory cells 12, and across the conductive interconnect 46; and is electrically coupled with the memory cells 12 and the conductive interconnect 46. The bitline comprises a first region 52 and a second region 54, with such regions being compositionally different than one another. The composition of the first region 52 may be referred to as a first composition, and the composition of the second region 54 may be referred to as a second composition.

In the illustrated embodiment, the first region 52 comprises two materials 56 and 58, and the second region 54 only comprises the material 58. In other embodiments, the regions 52 and 54 may comprise different numbers of materials than are shown in the example embodiment of FIG. 1. The illustrated materials 56 and 58 may be referred to as first and second materials, respectively. In some embodiments, the materials 56 and 58 may be considered to correspond to first and second layers, respectively; or to a lower layer and an upper layer, respectively.

The first material 56 directly contacts the upper surfaces 15 of the memory cells. The first material 56 does not extend to over the upper surface 47 of the conductive interconnect 46, and instead the second material 58 directly contacts the upper surface 47.

The conductive interconnect 46 has sidewall surfaces 49; and in the illustrated embodiment the first material 56 directly contacts such sidewall surfaces. In other embodiments, it may be only the conductive material 58 which directly contacts any surfaces of the conductive interconnect 46.

In some embodiments, the material 56 may have higher resistivity (i.e., lower conductivity) than the material 58. The combined materials 56 and 58 may be suitable for utilization as a bitline electrically coupled with the memory cells 12, but it may be desired for the electrical connection to the conductive interconnect 46 to only utilize the low-resistivity (high-conductivity) material 58; with the terms "low-resistivity" and "high-conductivity" meaning that the material 58 has lower resistivity (lower resistance) and corresponding higher conductivity (higher conductance) than the material 56, rather than meaning low-resistivity or high-conductivity in an absolute sense. The direct coupling of the interconnect 48 to the low-resistivity material 58 may enable enhanced transfer of signals from the bitline 50 to the conductive interconnect 48, which may improve speed and reliability relative to configurations in which the interconnect 46 couples to higher-resistivity material.

The conductive materials 56 and 58 may comprise any suitable composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the first conductive material 56 comprises, consists essentially of, or consists of one or more of C (carbon), WSiN (tungsten silicon nitride), WN (tungsten nitride) and TiN (titanium nitride), where the formulas indicate components rather than indicating specific stoichiometries; and the second conductive material 58 comprises, consists essentially of, or consists of one or more of Ta (tantalum), Pt (platinum), Cu (copper), W (tungsten) and Pd (palladium).

In some embodiments, the first region 52 of the bitline 50 may be considered to comprise two or more materials (e.g., the materials 56 and 58), and the second region 54 of the bitline may be considered to include a subset of the materials of the first region (e.g., comprises only the material 58 in the illustrated embodiment).

In some embodiments, the first material 56 may comprise a first metal (e.g., tungsten or titanium) in combination with one or more nonmetallic elements (e.g., one or more of silicon, nitrogen, carbon, etc.); and the second material 58 may consist of a second metal (e.g., one or more of Ta, Pt, Cu, W and Pd). The second metal of the material 58 may be the same as the first metal of the material 56, or may be different than the first metal of the material 56. In some specific applications, the first material 56 may consist of WSiN (where the chemical formula indicates constituents rather than a specific stoichiometry), and the second material 58 may consist of W.

Figure 1A:
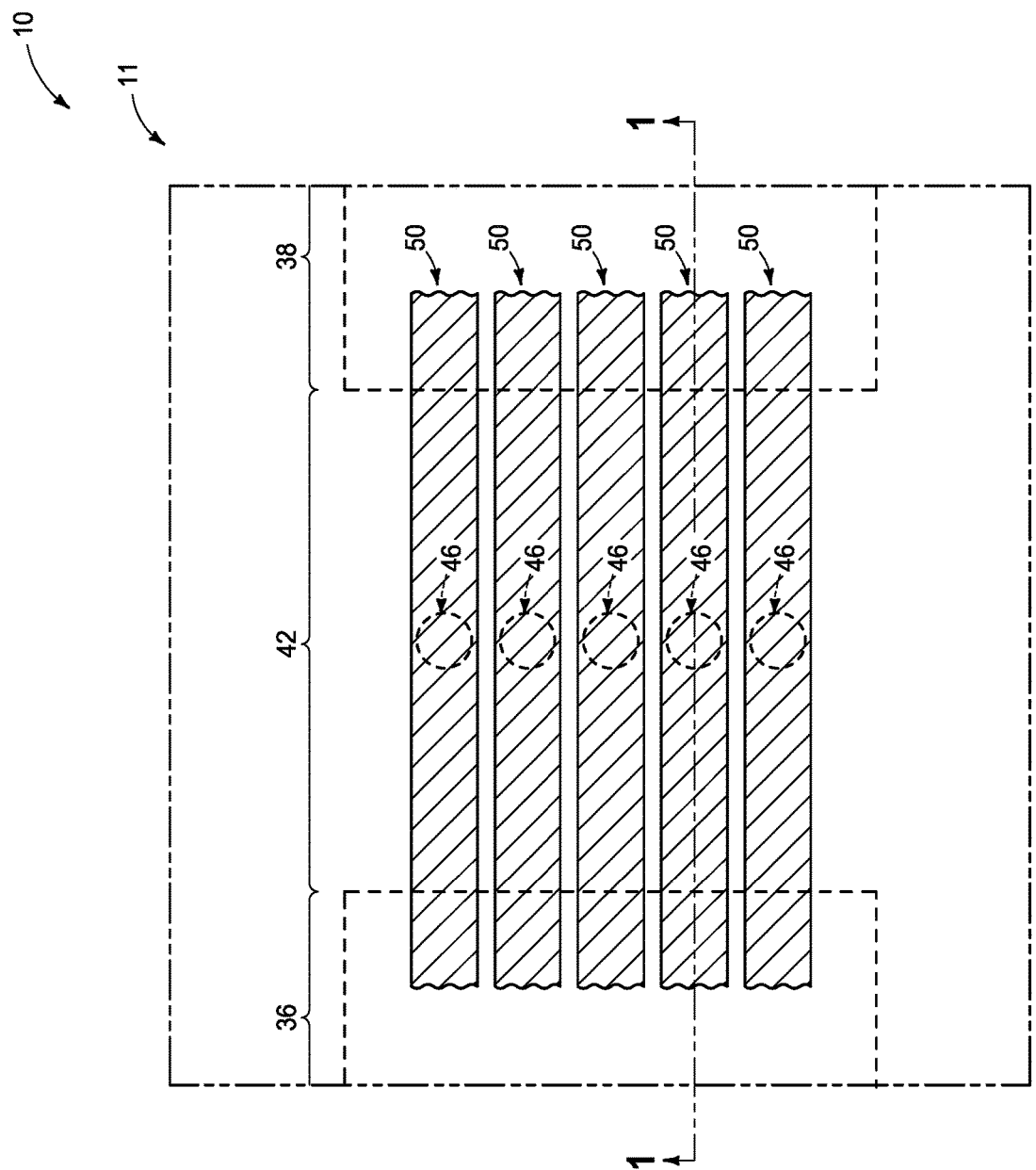
FIG. 1A is a diagrammatic top view of a region of the assembly of FIG. 1. The cross-section of FIG. 1 is along the line 1-1 of FIG. 1A.
Figure 1B:
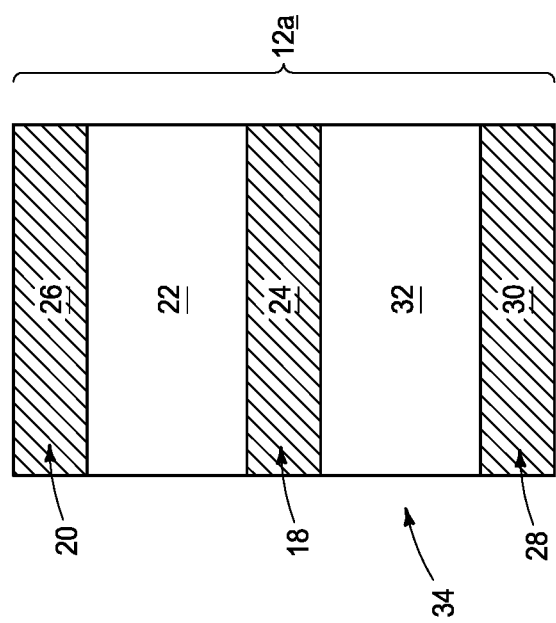
FIG. 1B is a diagrammatic cross-sectional side view of an example memory cell which may be utilized instead of the example memory cells shown in FIG. 1.

FIG. 1A shows a top view of the assembly 10. The view of FIG. 1A is not to scale relative to the view of FIG. 1, and utilizes a different diagrammatic representation of the assembly 10 than is utilized in FIG. 1. Regardless, the cross-section of FIG. 1 may be understood to be generally along the line 1-1 of FIG. 1A.

The coupling region 42 comprises a plurality of the conductive interconnects 46. The conductive interconnects are arranged along a row, with such row extending along a direction which would be in and out of the page relative to the plane of the cross-section of FIG. 1. The conductive interconnects may be circular-shaped in top-down view (as shown), or may have any other suitable shapes, including, for example, square shapes, rectangular shapes, elliptical shapes, etc.

It is to be understood that even though the cross-section of FIG. 1 only comprises one of the conductive interconnects 46 within the illustrated portion of the coupling region 42, in other embodiments there may be multiple conductive interconnects formed along the cross-section of FIG. 1. Accordingly, even though FIG. 1A shows a single row of the interconnects 46 within the coupling region 42, in other embodiments there may be multiple rows of such interconnects arranged in a matrix or other suitable configuration. Also, it is to be understood that the illustrated interconnects 46 of FIG. 1A may be representative of a large number of substantially identical interconnects formed within the coupling region 42. For instance, in some embodiments there may be hundreds, thousands, millions, hundreds of thousands, etc., of the conductive interconnects 46 formed within the coupling region 42.

FIG. 1A shows that a plurality of the bitlines 50 extend across the memory array 11 and the coupling region 42. Each of the bitlines extends across one of the illustrated conductive interconnects 46. The conductive interconnects 46 are shown in dashed-line view in FIG. 1A to indicate that they are under the bitlines 50. The illustrated bitlines 50 may be representative of a large number of substantially identical bitlines associated with the memory array 11. For instance, in some embodiments there may be hundreds, thousands, millions, hundreds of thousands, etc., of the bitlines 50 associated with the memory array.

The description of FIG. 1 indicates that the wordlines 14 are under the memory cells 12, and that the bitlines 56 are over the memory cells. In other applications, the relative orientation of the wordlines and bitlines may be reversed so that the bitlines are under the memory cells and the wordlines are over the memory cells. The terms "access/sense line," "bitline/wordline," "wordline/bitline" and "sense/access line" may be utilized herein to generically refer to bitlines and wordlines in contexts in which an indicated structure may be either a wordline or a bitline.

Figure 2:
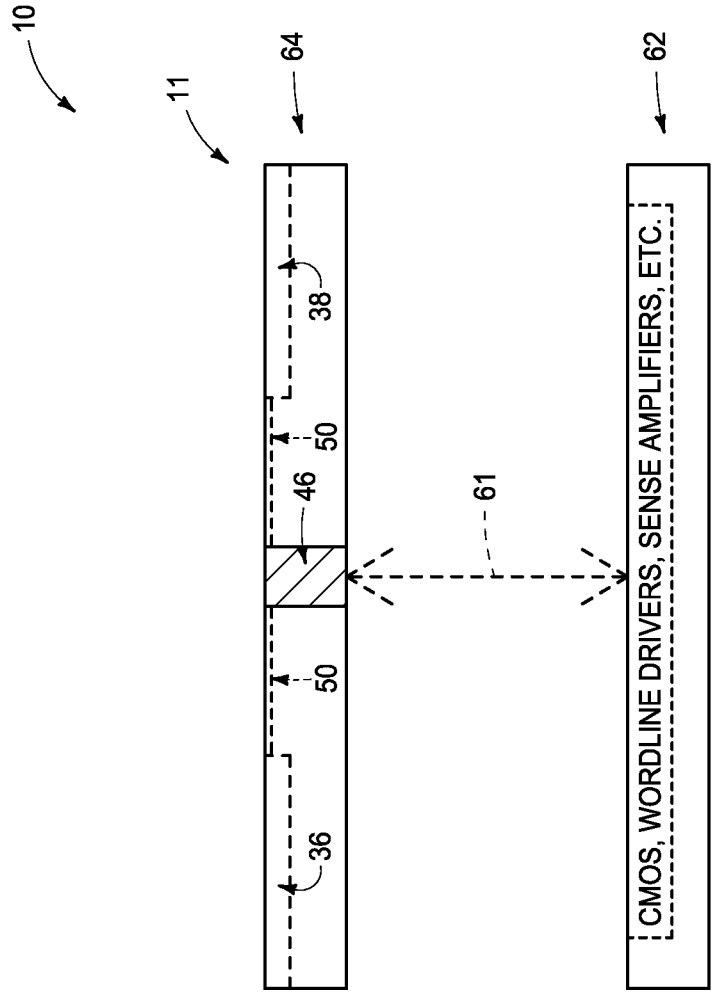
FIG. 2 is a diagrammatic cross-sectional side view of an example multitier configuration.

The conductive interconnects 46 of FIGS. 1 and 1A may be utilized to enable circuitry from one tier to be electrically coupled with circuitry of another tier within a multitier stack. For instance, FIG. 2 shows a multitier stack 60 having two tiers 62 and 64 in a vertical stack. The vertically-stacked arrangement of FIG. 2 may extend upwardly to include additional tiers. The tiers 62 and 64 may be considered to be examples of levels that are stacked one atop the other. The levels may be within different semiconductor dies (wafers), or may be within the same semiconductor die. The bottom tier 62 may include control circuitry and/or sensing circuitry (e.g., may include wordline drivers, sense amplifiers, etc.; and may include CMOS circuitry, as shown). The upper tier 64 may include a memory array, such as, for example, the memory array 11 of FIGS. 1 and 1A; and may be referred to as a memory tier.

The conductive interconnect 46 of FIG. 1 is illustrated as enabling electrical coupling of circuitry associated with the tier 64 to circuitry associated with the tier 62, with such electrical coupling being diagrammatically shown utilizing a dashed arrow 61. In an example embodiment, a sense/access line 50 associated with the memory array 11 is electrically coupled with circuitry of the tier 62 through the conductive interconnect 46. For instance, a bitline associated with the memory array within the tier 64 may be coupled with a sense amplifier within the tier 62 through the connection 61. As another example, a wordline associated with memory array within the tier 64 may be coupled with a wordline driver within the tier 62 through the connection 61.

Figure 3:
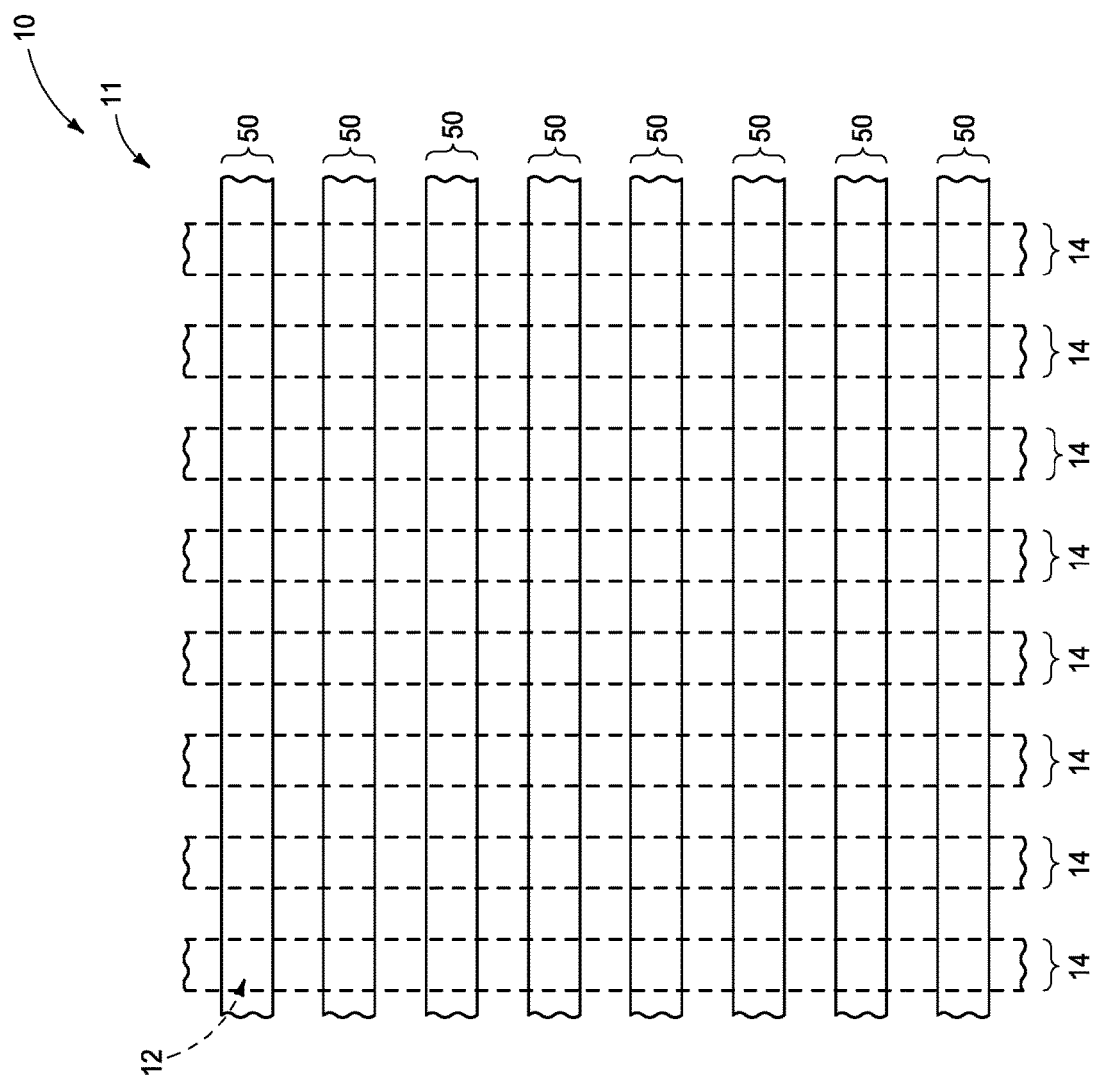
FIG. 3 is a diagrammatic top view of a region of the assembly of FIG. 1 illustrating the wordlines and bitlines in isolation from other components.

The memory array 11 of FIGS. 1 and 1A comprises a first series of sense/access lines 14 extending along a first direction (in and out of the page relative to the cross-section of FIG. 1), and a second series of sense/access lines 50 extending along a second direction (along a plane of the cross-section of FIG. 1), with the second direction being orthogonal to the first direction. FIG. 3 shows another diagrammatic top view of the assembly 10 of FIGS. 1 and 1A; and shows the wordlines 14 arranged as a first series of sense/access lines under the memory cells 12, and the bitlines 50 arranged as a second series of sense/access lines over the memory cells 12. The memory cells 12 are not visible in FIG. 3, but are to be understood as being at cross-points where the sense/access lines 50 cross the sense/access lines 14 (with a dashed arrow diagrammatically illustrating an example cross-point location of a memory cell 12).

Figure 4:
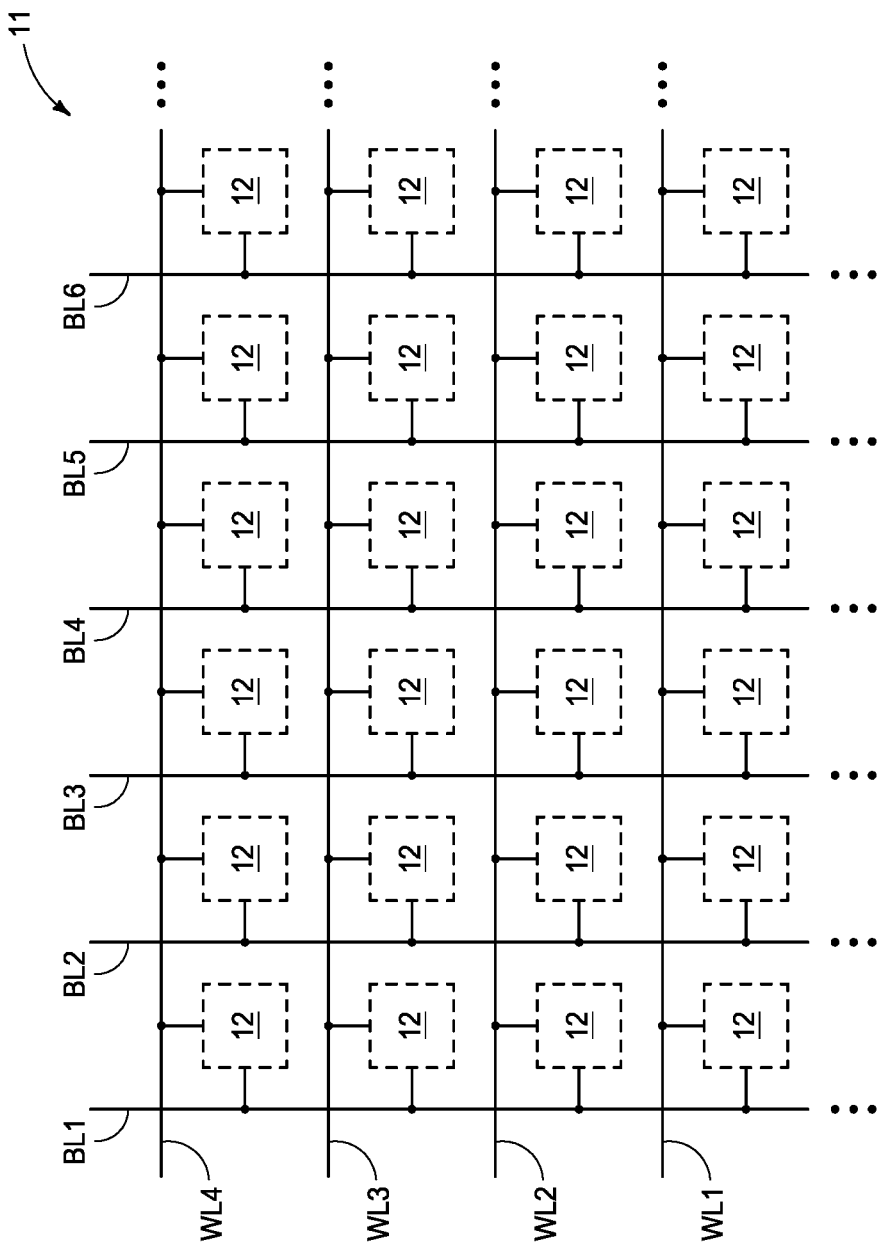
FIG. 4 is a diagrammatic schematic view of an example memory array.

The memory array 11 of FIGS. 1 and 1A may have any suitable configuration. FIG. 4 schematically illustrates an example configuration of the memory array 11. Such configuration includes the memory cells 12 at cross-points where wordlines (WL1-WL4) pass the bitlines (BL1-BL6). Each of the memory cells is uniquely addressed through a combination of one of the wordlines and one of the bitlines.

The configuration of FIGS. 1 and 1A may be formed with any suitable processing. Example processing is described with reference to FIGS. 5-9.

Figure 5:
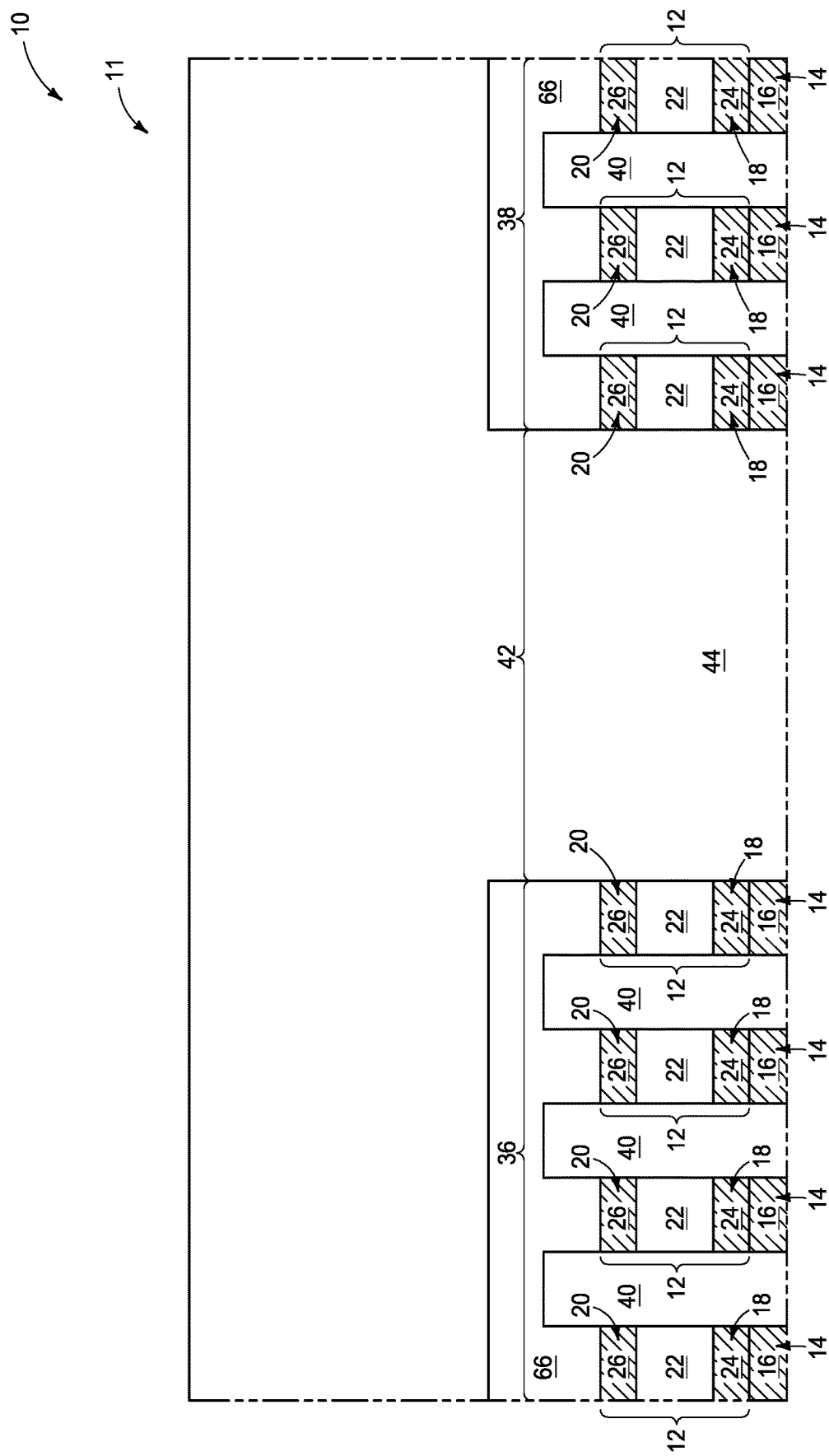
FIG. 5 is a diagrammatic cross-sectional side view of an assembly at an example process stage of an example embodiment.

Referring to FIG. 5, a capping material 66 is over the first and second sets (36, 38) of the memory cells 12. The capping material 66 may comprise any suitable composition(s); and in some embodiments may comprise, consist essentially of, or consist of silicon nitride. The insulative material 44 is provided over the capping material 66 and across the coupling region 42. In some embodiments, the insulative material 44 may be considered to extend across an intervening region between the sets 36, 38 of memory cells 12; with such intervening region corresponding to the coupling region 42. The memory cells 12 of FIG. 5 may be replaced with other memory cells (e.g., memory cells having the configuration of the memory cell 12a of FIG. 1A) in other embodiments.

Figure 6:
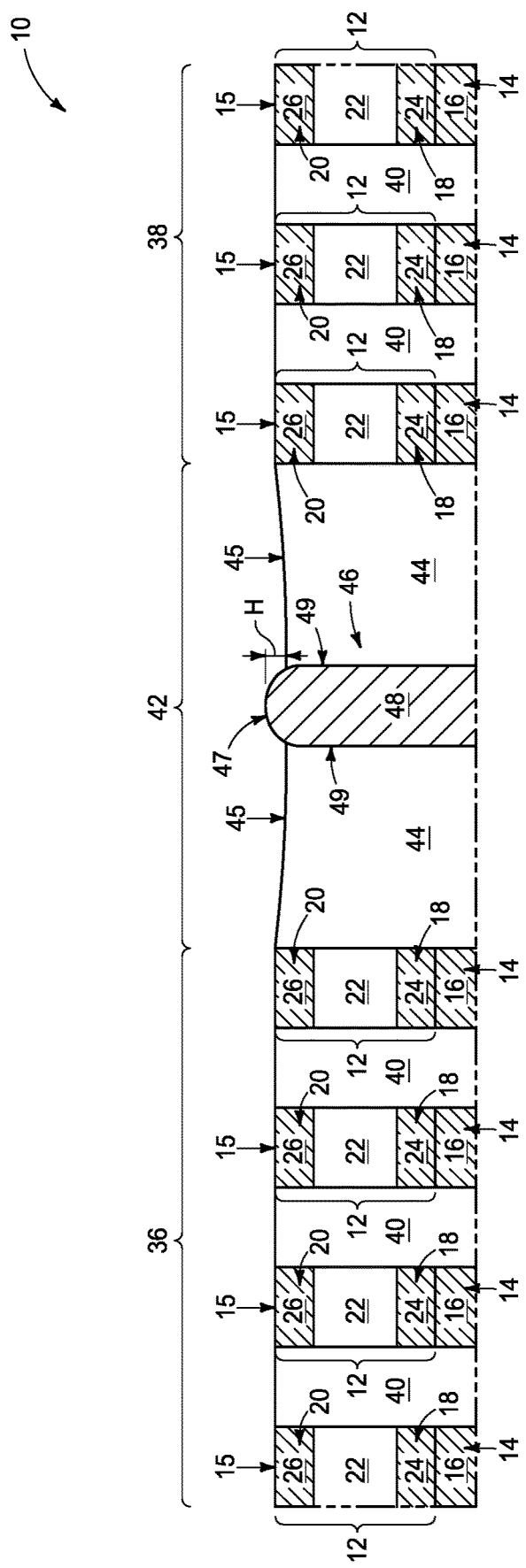
FIG. 6 is a diagrammatic cross-sectional side view of the assembly of FIG. 5 at an example process stage following that of FIG. 5.

Referring to FIG. 6, the assembly 10 is shown after formation of the conductive interconnect 46 within the coupling region 42; and after one or more polishing processes have been utilized to expose the upper surfaces 15 of the memory cells 12, and the upper surface 47 of the conductive interconnect 46.

The conductive interconnect 46 may be formed with any suitable processing. For instance, in some example embodiments a via may be formed to extend through the materials within the coupling region 42, and then suitable conductive material(s) may be provided within the via to form the conductive interconnect 46.

The upper surface 47 of the conductive interconnect 46 projects above an upper surface 45 of the polished material 44. Such may be a natural consequence of polishing (e.g., chemical-mechanical polishing, CMP) due to the relative hardness of the conductive material 48 as compared to the silicon dioxide 44. The upper surface 47 of the conductive interconnect 48 is above the upper surface 45 of the insulative material 44 by a height H. Such height may be at least about 10 Å, at least about 20 Å, at least about 50 Å, etc.

FIG. 6A shows a top view of the assembly 10 at the processing stage of FIG. 6 utilizing a diagrammatic illustration analogous to that of FIG. 1A. The view of FIG. 6A shows that the conductive interconnect 46 of FIG. 6 may be one of many substantially identical conductive interconnects, with others of the conductive interconnect being formed out of the plane of the cross-section of FIG. 6.

Figure 7:
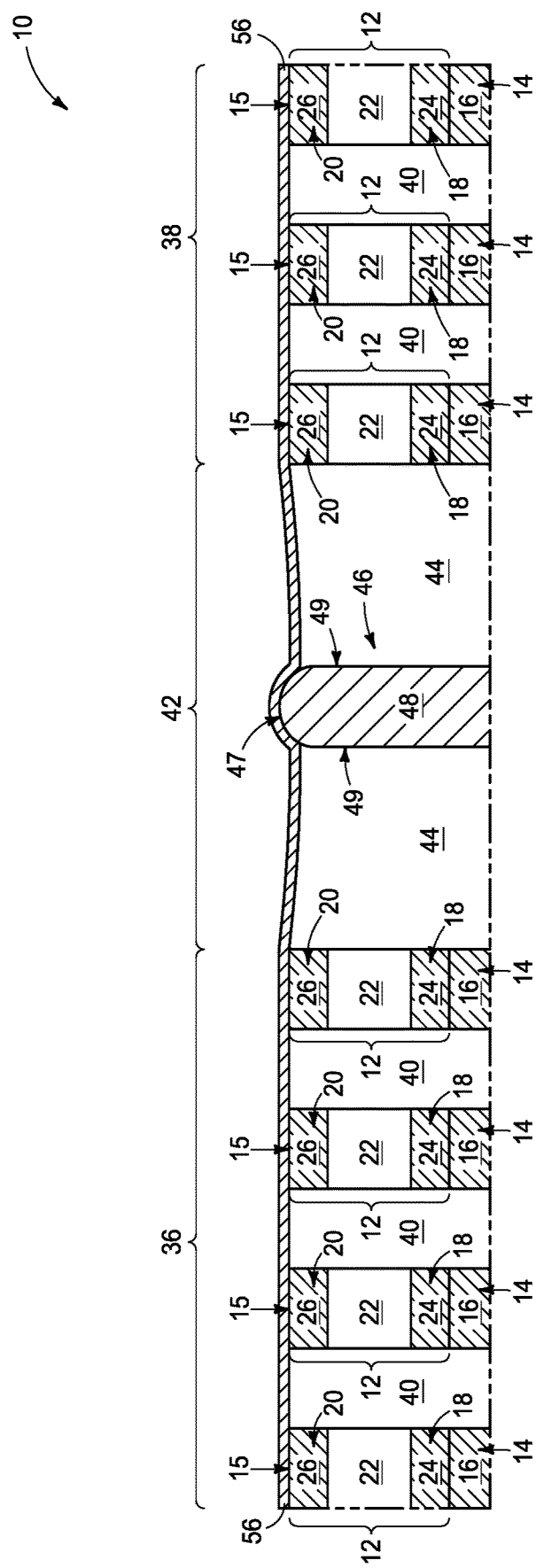
FIG. 7 is a diagrammatic cross-sectional side view of the assembly of FIG. 5 at an example process stage following that of FIG. 6.

Referring to FIG. 7, the conductive material 56 is formed along an upper surface of the assembly 10. The conductive material 56 extends across the memory cells 12, and across the conductive interconnect 46; and directly contacts the upper surfaces 15 of the memory cells 12, and the upper surface 47 of the conductive interconnect 46.

Figure 8:
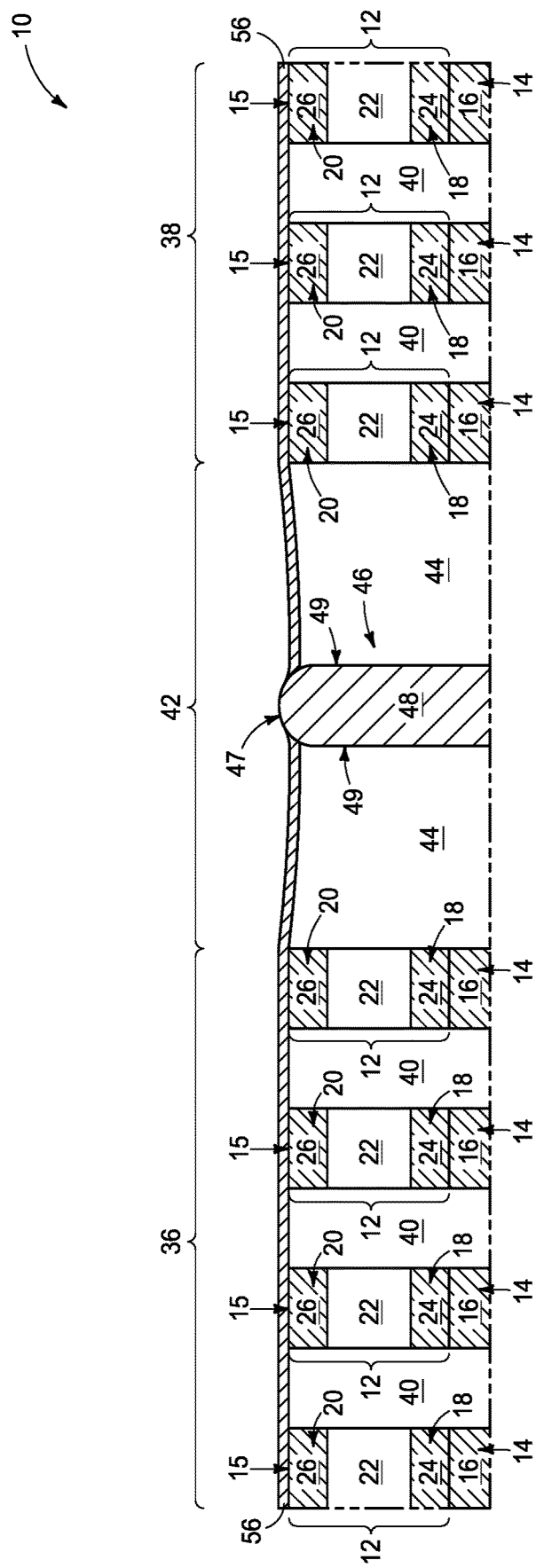
FIG. 8 is a diagrammatic cross-sectional side view of the assembly of FIG. 5 at an example process stage following that of FIG. 7.

Referring to FIG. 8, the conductive material 56 is removed from over the upper surface 47 of the conductive interconnect 46, while leaving portions of the conductive material 56 remaining over the memory cells 12 of the first and second sets 36 and 38. The conductive material 56 may be removed from over the surface 47 with any suitable processing; and in some embodiments is removed with a polishing process (e.g., CMP).

Figure 9:
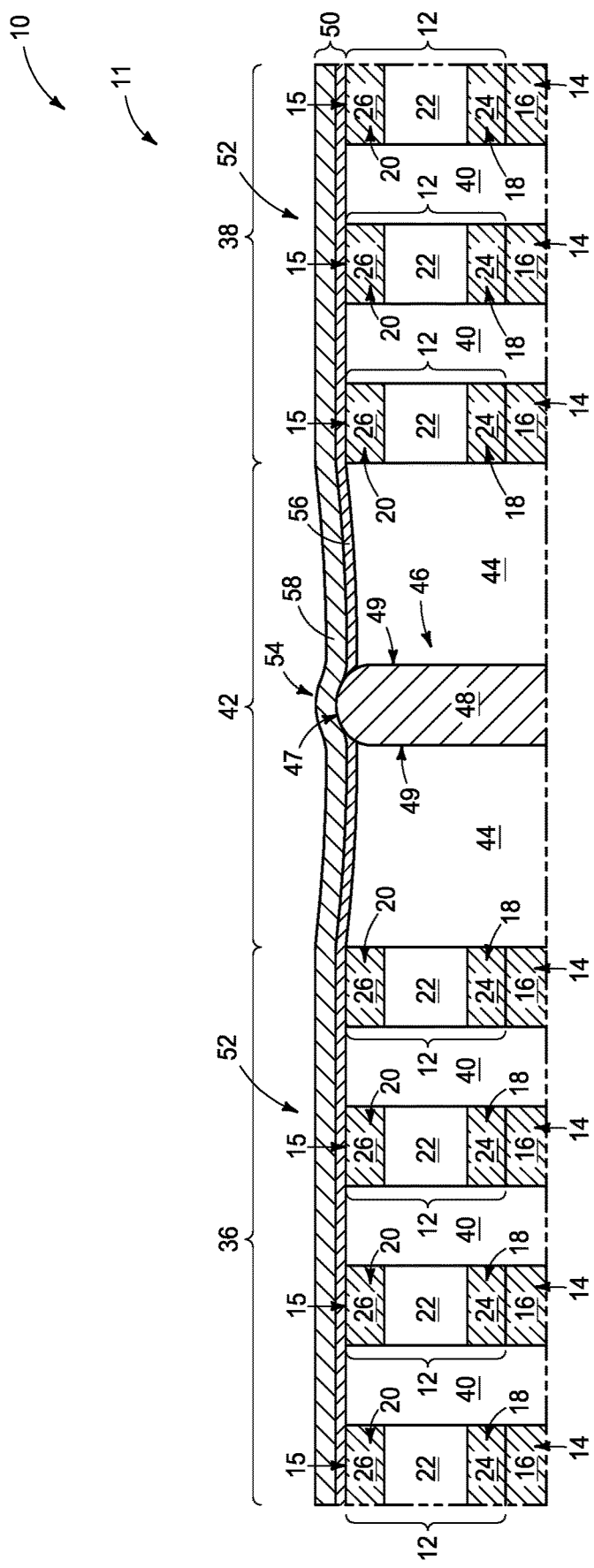
FIG. 9 is a diagrammatic cross-sectional side view of the assembly of FIG. 5 at an example process stage following that of FIG. 8.

Referring to FIG. 9, the conductive material 58 is formed over the conductive material 56, and the conductive materials 56 and 58 are together patterned into a bitline 50. The assembly 10 of FIG. 9 comprises the configuration described above with reference to FIG. 1. FIG. 9A shows a top view of the assembly 10 at the processing stage of FIG. 9 utilizing a diagrammatic illustration analogous to that of FIG. 1A. The view of FIG. 9A shows that the bitline 50 is one of many substantially identical bitlines which may be fabricated utilizing the processing of FIGS. 5-9.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multi-chip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an arrangement having a first tier which includes a first set of memory cells on one side of a coupling region, and a second set of memory cells on an opposing side of the coupling region. A first series of sense/access lines are under the memory cells of the first and second sets, and are electrically connected with the memory cells of the first and second sets. A conductive interconnect is within the coupling region of the memory tier. A sense/access line of a second series extends across the memory cells of the first and second sets, and across the conductive interconnect. The sense/access line of the second series has a first region of a first composition, and has a second region of a second composition. The first region is over the memory cells of the first and second series, and is electrically connected with the memory cells of the first and second series. The second region is over the conductive interconnect and is electrically coupled with the conductive interconnect. A second tier is vertically offset from the first tier. The second tier includes circuitry which is coupled with the conductive interconnect.

Some embodiments include an arrangement having a memory tier which includes a first set of memory cells on one side of a coupling region, and a second set of memory cells on an opposing side of the coupling region. A first series of sense/access lines are under the memory cells of the first and second sets, and are electrically connected with the memory cells of the first and second sets. A conductive interconnect is within the coupling region of the memory tier. A sense/access line of a second series extends across the memory cells of the first and second sets, and across the conductive interconnect. The sense/access line of the second series has a first region having a second conductive material over a first conductive material, and has a second region having only the second conductive material. The first region is over the memory cells of the first and second series and is electrically connected with the memory cells of the first and second series. The second region is over the conductive interconnect and is electrically coupled with the conductive interconnect. An additional tier is under the memory tier. The additional tier includes CMOS circuitry which is coupled with the conductive interconnect.

Some embodiments include a method of forming an arrangement. An assembly is formed to comprise, along a cross-section, a first set of memory cells on one side of a coupling region, and a second set of memory cells on an opposing side of the coupling region. An intervening insulative material is within the coupling region. The memory cells of the first and second sets are over a first series of sense/access lines. A conductive interconnect is formed within the coupling region and extends through the intervening insulative material. A first conductive material is formed to extend across the memory cells of the first and second sets, and across the conductive interconnect. The first conductive material directly contacts upper surfaces of the memory cells and an upper surface of the conductive interconnect. The first conductive material is removed from over the upper surface of the conductive interconnect, while remaining portions of the first conductive material are left over the memory cells of the first and second sets. A second conductive material is formed over the remaining portions of the first conductive material and over the upper surface of the conductive interconnect. The first and second conductive materials are patterned into a sense/access line of a second series.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming an arrangement, comprising:
forming an assembly comprising, along a cross-section, a first set of memory cells on one side of a coupling region, and a second set of memory cells on an opposing side of the coupling region; an intervening insulative material being within the coupling region; the memory cells of the first and second sets being over a first series of sense/access lines;
forming a conductive interconnect within the coupling region and extending through the intervening insulative material;
forming a first conductive material to extend across the memory cells of the first and second sets, and across the conductive interconnect; the first conductive material directly contacting upper surfaces of the memory cells and an upper surface of the conductive interconnect;
removing the first conductive material from over the upper surface of the conductive interconnect, while leaving remaining portions of the first conductive material over the memory cells of the first and second sets; and
forming a second conductive material over the remaining portions of the first conductive material and over the upper surface of the conductive interconnect, and patterning the first and second conductive materials into a sense/access line of a second series.

2. The method of claim 1 wherein the removing of the first conductive material utilizes a polishing process.

3. The method of claim 1 wherein:
the cross-section is along a plane; and
the conductive interconnect is one of many substantially identical conductive interconnects, with others of the conductive interconnects being formed out of the plane of the cross-section.

4. The method of claim 3 wherein the sense/access line of the second series is one of many sense/access lines of the second series, with others of the sense/access lines of the second series being formed out of the plane of the cross-section.

5. The method of claim 4 wherein the sense/access lines of the first series are wordlines, and wherein the sense/access lines of the second series are bitlines.

6. The method of claim 1 wherein the memory cells of the first and second sets are self-selecting memory cells comprising chalcogenide.

7. The method of claim 6 wherein the memory cells of the first and second sets include upper and lower electrodes, and wherein the chalcogenide is between the upper electrodes and the lower electrodes.

8. The method of claim 1 wherein each of the memory cells of the first and second sets includes a programmable material and a select device.

9. The method of claim 8 wherein the memory cells of the first and second sets include upper electrodes, lower electrodes and middle electrodes between the upper and lower electrodes; a first ovonic material being between the upper electrodes and the middle electrodes, and a second ovonic material being between the middle electrodes and the lower electrodes; one of the first and second ovonic materials being the programmable material of the memory cells, and the other of the first and second ovonic materials being incorporated into ovonic threshold switches of the select devices.

10. The method of claim 1 wherein the memory cells of first and second sets are within one tier of a multitier configuration; and wherein the conductive interconnect is coupled with circuitry in another tier of the multitier configuration, with said other tier being vertically offset from said one tier.

11. The method of claim 10 wherein said other tier is below said one tier, and wherein the circuitry in said other tier includes CMOS circuitry.

12. The method of claim 1 wherein the first conductive material has a higher resistance than the second conductive material.

13. The method of claim 1 wherein the first conductive material comprises one or more of carbon, WSiN, WN and TiN, where the chemical formulas indicate constituents rather than specific stoichiometries; and wherein the second conductive material comprises one or more of Ta, Pt, Cu, W and Pd.

14. The method of claim 1 wherein the first and second conductive materials comprise metal.

15. The method of claim 1 wherein the first conductive material comprises a first metal in combination with one or more non-metallic elements, and wherein the second conductive material consists of a second metal.

16. The method of claim 15 wherein the first and second metals are the same.

17. The method of claim 16 wherein the first conductive material consists of WSiN, where the chemical formula indicates constituents rather than a specific stoichiometry; and wherein the second conductive material consists of W.

18. The method of claim 15 wherein the first and second metals are different.

* * * * *